(12) United States Patent
Forgacs et al.

(10) Patent No.: US 11,143,268 B2
(45) Date of Patent: Oct. 12, 2021

(54) VIBRATION ISOLATION SYSTEM WITH THERMAL GROWTH COMPENSATION

(71) Applicant: Raytheon Company, Waltham, MA (US)

(72) Inventors: Stephen J. Forgacs, Tucson, AZ (US); Bradley E. Bergmann, Tucson, AZ (US); Nicholas E. Kosinski, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 27 days.

(21) Appl. No.: 16/440,125

(22) Filed: Jun. 13, 2019

(65) Prior Publication Data
US 2019/0383351 A1 Dec. 19, 2019

Related U.S. Application Data

(60) Provisional application No. 62/684,300, filed on Jun. 13, 2018.

(51) Int. Cl.
*F16F 1/02* (2006.01)
*F16F 15/02* (2006.01)
(Continued)

(52) U.S. Cl.
CPC ............ *F16F 15/022* (2013.01); *F16F 13/00* (2013.01); *F42B 15/08* (2013.01); *H05K 5/0217* (2013.01);
(Continued)

(58) Field of Classification Search
CPC .. F16F 1/025; F16F 1/182; F16F 1/185; F16F 1/187; F16F 1/22; F16F 1/26; F16F 1/328;
(Continued)

(56) References Cited

U.S. PATENT DOCUMENTS 1,890,853 A * 12/1932 Howard .................... F16F 1/22
267/47
1,912,451 A * 6/1933 Hibbard ................ F16F 15/073
248/578
(Continued)

FOREIGN PATENT DOCUMENTS

| CN | 108980534 A | * 12/2018 |
|---|---|---|
| DE | 102015011224 | 7/2016 |
| EP | 3147536 | 3/2017 |

OTHER PUBLICATIONS

International Search Report and Written Opinion for corresponding PCT Application PCT/US2019/036935 dated Oct. 17, 2019.

*Primary Examiner* — Robert A. Siconolfi
*Assistant Examiner* — Stephen M Bowes
(74) *Attorney, Agent, or Firm* — Renner, Otto, Boisselle & Sklar, LLP

(57) ABSTRACT

A vibration isolation system includes multiple isolators between an inner object and an outer housing that surrounds the object. In one example the inner object may be a rack or container that holds electronics, such as printed circuit boards, and the outer housing may be a housing for a missile, such as a supersonic or hypersonic missile. The isolators have flexures to attenuate vibrations, isolating the inner object at least in part from vibrations encountered by the outer housing. The flexures may be oriented in different directions for different isolators to change the resonant frequency of the system for a given axis. In addition the isolators are able to compensate for differences in expansion between the inner object and the outer housing. The isolators may also include multi-part isolators that have spring-loaded wedge elements used to expand the isolators in one or more radial directions.

19 Claims, 4 Drawing Sheets

(51) Int. Cl.
*F16F 13/00* (2006.01)
*F42B 15/08* (2006.01)
*H05K 5/02* (2006.01)

(52) U.S. Cl.
CPC ... *F16F 2224/0208* (2013.01); *F16F 2228/08* (2013.01); *F16F 2230/0005* (2013.01)

(58) Field of Classification Search
CPC .. F16F 1/3683; F16F 1/046; F16F 1/02; F16F 15/1211; F16F 15/1214; F16F 15/1217; F16F 15/1219; F16F 15/04; F16F 15/06; F16F 15/073; F16F 2222/02; B60G 11/34; H01R 33/975
See application file for complete search history.

(56) References Cited

U.S. PATENT DOCUMENTS

| | | | | |
|---|---|---|---|---|
| 2,032,456 A | * | 3/1936 | Wolf | B60G 11/34 267/239 |
| 2,063,216 A | * | 12/1936 | Zaparka | B60G 11/34 267/30 |
| 2,527,541 A | * | 10/1950 | Gibbs | B65D 81/07 215/386 |
| 2,973,196 A | * | 2/1961 | Scheublein, Jr. | B60G 11/34 267/45 |
| 3,162,723 A | * | 12/1964 | McCurtain | H01B 17/14 174/138 G |
| 3,730,508 A | * | 5/1973 | Marian | F16F 1/26 267/52 |
| 4,512,559 A | * | 4/1985 | Aoyama | B60G 11/113 267/158 |
| 5,769,381 A | * | 6/1998 | Patin | F16F 15/02 248/618 |
| 6,264,179 B1 | | 7/2001 | Bullard | |
| 2006/0171127 A1 | * | 8/2006 | Kadoya | H05K 3/284 361/752 |
| 2012/0049422 A1 | * | 3/2012 | Gnateski | F16F 15/08 267/140.13 |
| 2014/0234100 A1 | | 8/2014 | Hamaguchi et al. | |

* cited by examiner

VIBRATION ISOLATION SYSTEM WITH THERMAL GROWTH COMPENSATION

This application claims priority to U.S. Provisional Application 62/684,300, filed Jun. 13, 2018, which is incorporated by reference in its entirety.

GOVERNMENT LICENSE RIGHTS

This invention was made with government support under contract HR0011-17-C-0025 awarded by the United States Department of Defense. The government has certain rights in the invention.

FIELD OF THE INVENTION

The invention is in the field of vibration isolation.

DESCRIPTION OF THE RELATED ART

In some situations dynamic isolation is desirable to reduce potential damaging frequency content to critical components. Specific applications experiencing large thermal gradients results in either ineffective isolation or failure of the isolation member due to increase stress. This problem has not been satisfactorily addressed.

SUMMARY OF THE INVENTION

A vibration isolation system includes isolators that allow for displacement between an object to be isolated, and a housing, frame, or other structure that encounters vibrations or shocks from which the object is to be isolated.

A vibration isolation system includes isolators that slide, allowing for relative displacement in a longitudinal direction.

A vibration isolation system includes isolators capable of expanding, to accommodate relative displacement in a radial direction.

A vibration isolation system includes both single-piece isolators with flexures, and multi-piece isolators.

A vibration isolation system that is part of a missile includes isolators with the ability to compensate for expansion of a fuselage of the missile by heating.

According to an aspect of the invention, a vibration isolation system includes: an outer housing; an inner object within the outer housing; and multiple isolators between the inner object and the outer housing; wherein each of the multiple isolators includes a flexure; and wherein some of the isolators include an expander or expansion mechanism to compensate for changes in distance between the inner object and the outer housing.

According to an embodiment of any paragraph(s) of this summary, the outer housing is part of a missile.

According to an embodiment of any paragraph(s) of this summary, the inner object is a hardware mount.

According to an embodiment of any paragraph(s) of this summary, the system further includes equipment in the hardware mount.

According to an embodiment of any paragraph(s) of this summary, the system further includes electronic cards, devices, or elements in the hardware mount.

According to an embodiment of any paragraph(s) of this summary, at least some of the isolators are single-piece isolators.

According to an embodiment of any paragraph(s) of this summary, at least some of the isolators are multi-part isolators, able to change length.

According to an embodiment of any paragraph(s) of this summary, at least some of the isolators slide relative to one of the outer housing or the inner object.

According to an embodiment of any paragraph(s) of this summary, at least some of the isolators slide relative to one of the outer housing or the inner object in a longitudinal direction.

According to an embodiment of any paragraph(s) of this summary, at least some of the isolators slide relative to the outer housing, such as in a longitudinal direction.

According to an embodiment of any paragraph(s) of this summary, at least some of the isolators are multi-part isolators that each include: an inner isolator part; an outer isolator part; a wedge element; and at least one spring.

According to an embodiment of any paragraph(s) of this summary, one of the isolator parts has a flexure; and the at least one spring provides a force on the wedge element to provide a force separating the inner isolator part and the outer isolator part.

According to an embodiment of any paragraph(s) of this summary, the flexure is in the outer isolation part.

According to an embodiment of any paragraph(s) of this summary, the parts have respective sloped surfaces that together define a channel that receives a wedge portion of the wedge element.

According to an embodiment of any paragraph(s) of this summary, the at least one spring includes a pair of springs pulling on opposite sides of the wedge element.

According to an embodiment of any paragraph(s) of this summary, the wedge portion has a wedge angle of between 10 and 20 degrees.

According to an embodiment of any paragraph(s) of this summary, the wedge portion has a wedge angle of 15 degrees.

According to an embodiment of any paragraph(s) of this summary, the isolators that slide in a first direction; and the some of the isolators expand in a second direction that is perpendicular to the first direction.

According to an embodiment of any paragraph(s) of this summary, the first direction is a longitudinal direction.

According to an embodiment of any paragraph(s) of this summary, the isolators that slide against contact pads.

According to an embodiment of any paragraph(s) of this summary, the flexures are S-shape flexures.

According to an embodiment of any paragraph(s) of this summary, middle portions of the S-shape flexures have different orientations for some of the S-shape flexures than for other of the S-shape flexures.

According to another aspect of the invention, a vibration isolator includes: an inner isolator part; an outer isolator part; a wedge element; and at least one spring; wherein one of the isolator parts has a flexure; and wherein the at least one spring provides a force on the wedge element to provide a force separating the inner isolator part and the outer isolator part.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The annexed drawings, which are not necessarily to scale, show various aspects of the invention.

DETAILED DESCRIPTION

Figure 1:
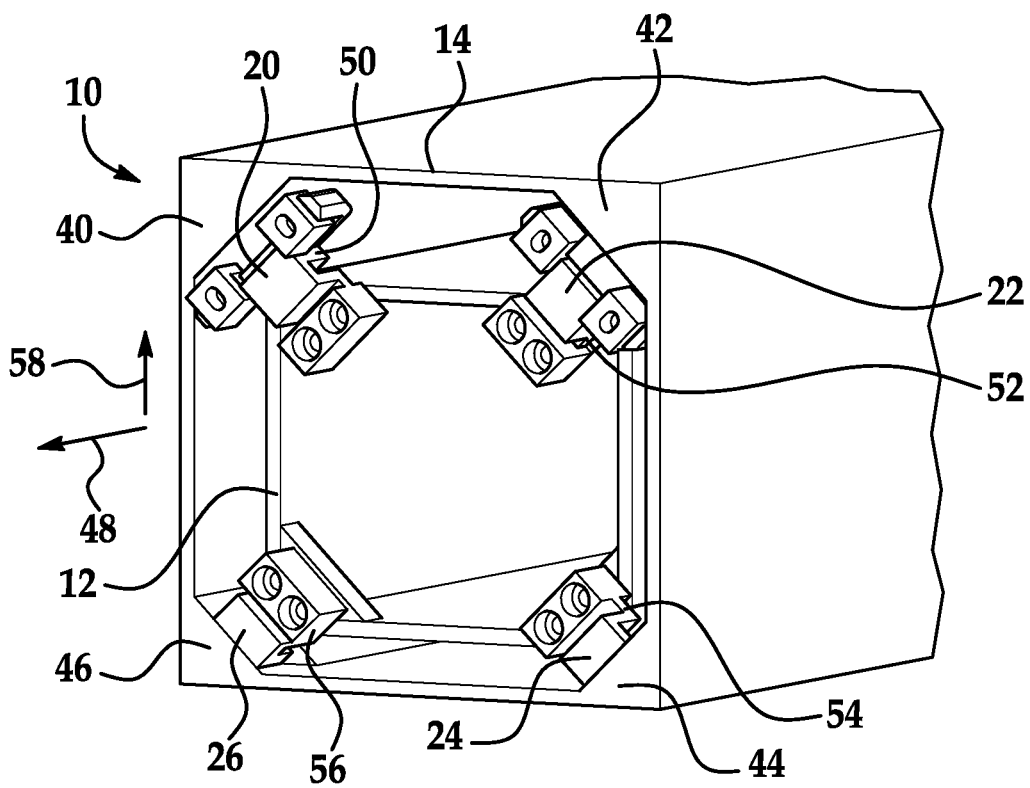
FIG. 1 is an oblique view showing a forward portion of a vibration isolation system in accordance with an embodiment of the invention.
Figure 2:
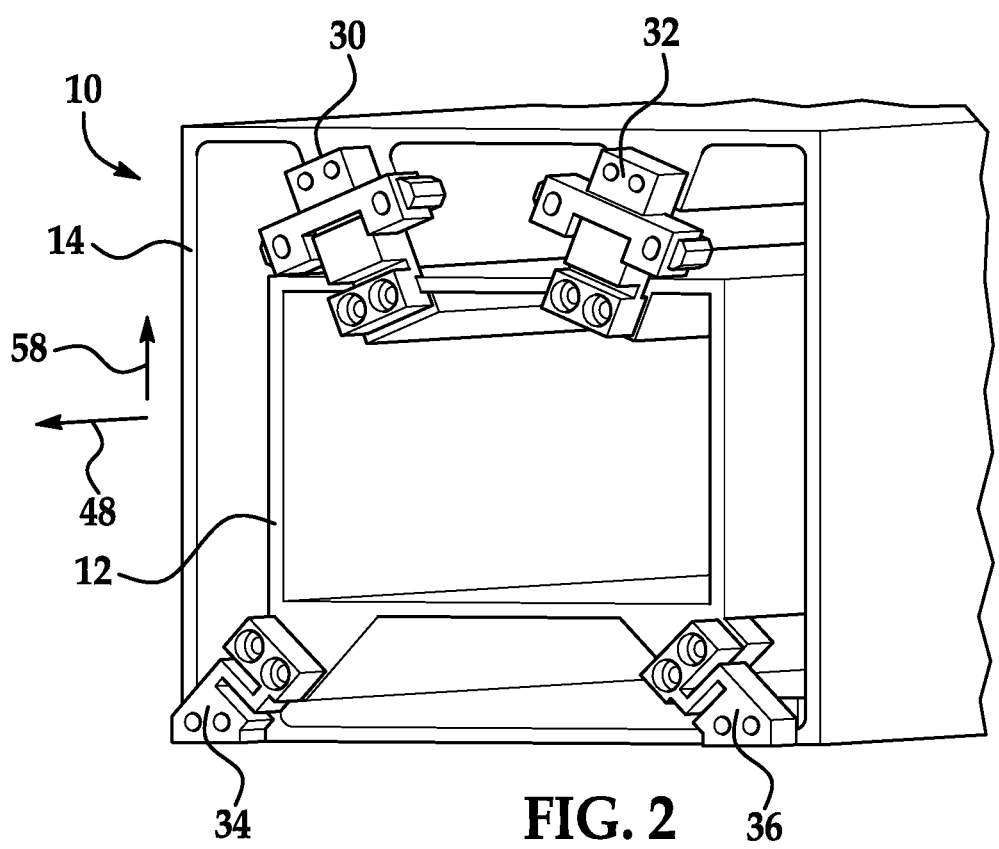
FIG. 2 is an oblique view showing an aft portion of the vibration isolation system of FIG. 1.

A vibration isolation system includes multiple isolators between an inner object and an outer housing that surrounds the object. In one example the inner object may be a rack or container that holds electronics, such as printed circuit boards, and the outer housing may be a housing for a missile, such as a supersonic or hypersonic missile. The isolators have flexures to attenuate vibrations, isolating the inner object at least in part from vibrations encountered by the outer housing. The flexures may be oriented in different directions for different isolators to change the resonant frequency of the system for a given axis. In addition the isolators are able to compensate for differences in expansion between the inner object and the outer housing, for example due to temperature differences between the inner object and the outer housing. The isolators may include isolators that slide relative to the outer housing or the inner object, in order to accommodate relative longitudinal growth between the inner object and the outer housing. The isolators may also include multi-part isolators that have spring-loaded wedge elements used to expand the isolators in one or more radial directions. There may be multiple isolators at forward and aft longitudinal locations between the isolated object and the outer housing. Some of the isolators being both multi-part isolators or single-piece isolators which are either fixed or free to slide FIGS. 1 and 2 show a vibration isolation system 10 that is used to isolate an inner object 12 from vibrations in an outer housing 14 that surrounds the inner object 12. FIG. 1 shows a forward portion of the system 10, with forward isolators 20, 22, 24, and 26. FIG. 2 shows an aft portion of the system 10, with aft isolators 30, 32, 34, and 36.

All of the isolators 20-36 aid in attenuating vibrations, with flexures of the isolators 20-36 helping to prevent vibrations and shocks at the outer housing 14 from being transmitted to the inner object 12. In addition the isolators 20-36 are configured to allow displacement of the inner object 12 relative to the outer housing 14, in both a longitudinal direction (or first direction) and in radial directions (or second directions) that are perpendicular to the longitudinal direction (first direction). This may be done (for example) to compensate for relative growth between the outer housing 14 and inner object 12 due to differences in thermal expansion. This difference will occur due to the outer housing 14 heating up during use faster than does the inner object 12. All of these aspects of the system 10 are described in greater detail below.

The forward isolators 20-26 may be fixedly attached to the inner object 12, such as at corners of the inner object 12. The outer ends of the isolators 20-26 rest on respective contact pads 40, 42, 44, and 46, with the isolators 20-26 free to slide in a longitudinal direction 48 along the contact pads 40-46. This allows for the system 10 to compensate for different amounts of expansion in the longitudinal direction 48, for instance caused by different amounts of heating of the outer housing 14 and the inner object 12 and the distance between mounting points of the forward and aft isolators. It will be appreciated that alternatively the forward isolators 20-26 may be fixedly attached to the outer housing 14, and free to slide in the longitudinal direction 48 relative to the inner object 12.

The forward isolators 20-26 have respective flexures 50, 52, 54, and 56. The flexures 50-56 are thinned S-shape portions of the isolators 20-26, where the isolators 20-26 preferentially flex to attenuate vibrations. In the illustrated embodiments the flexures 50-56 are oriented such that the middle portions of the S-shape flexures 50-56 extend in the longitudinal direction 48. However alternatively the flexures 50-56 may have other orientations.

In one example the flexures 50-56 have a thickness of 5 mm (0.2 inches), but a wide variety of other thicknesses are possible. The flexures may have a width of 25 mm (1 inch) and a height of 76 mm (3 inches), but again these are non-limiting example values, and a wide variety of alternative dimensions are possible depending on the required natural frequency of the system. In practice, the isolators attenuate vibrations above an isolation frequency.

The isolators 24 and 26 are single-piece isolators. These isolators are fixed and do not allow for expansion in the radial direction 58. In this description "radial direction" refers to any direction that is perpendicular to the longitudinal direction 48.

Figure 3:
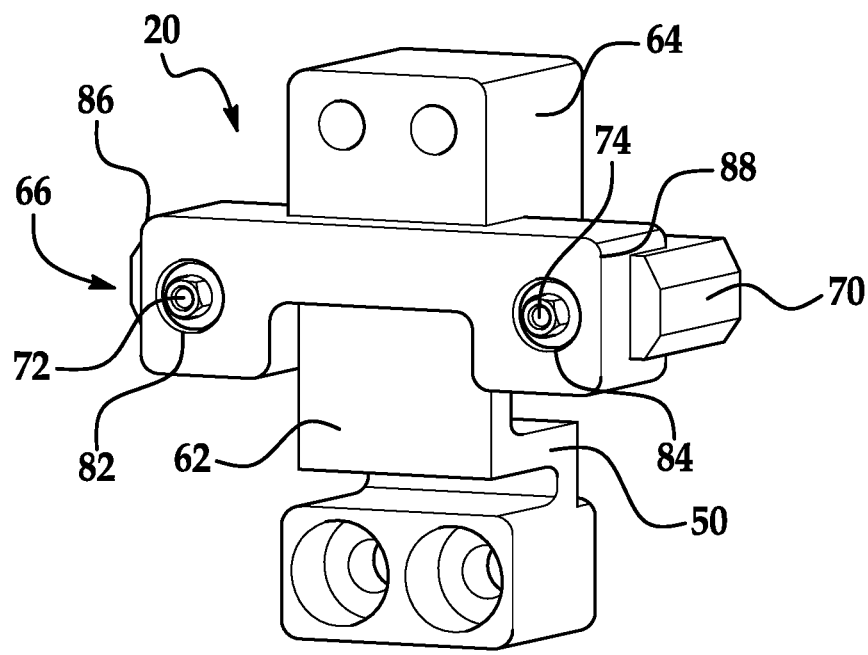
FIG. 3 is an oblique view of one of the isolators of the vibration isolation system of FIG. 1.

The other two forward isolators 20 and 22 are multi-part isolators that have wedge expanders or expansion mechanisms to allow extension in the radial direction 58. With reference now in addition to FIGS. 3-7, details of the multi-part isolator 20 are described. The isolator shown in FIG. 3 is actually one of the aft isolators, but apart from a sliding connection at one end versus a fixed connection, the forward and aft multi-part isolators have identical configurations. The isolator 20 includes an inner isolator part 62 and an outer isolator part 64, with an expander or expansion mechanism 66 between the parts 62 and 64, for providing controlled expansion of the isolator 20 in the radial direction by moving the parts 62 and 64 apart.

The expansion mechanism (expander) 66 includes a wedge element or wedge part 70, and a pair of fasteners 72 and 74 that initially mechanically couple side flanges of the wedge element 70, such as a side flange 76, to the outer part 64. The fasteners 72 and 74 may be threaded fasteners such as bolts. The fasteners 72 and 74 pass through slotted holes 82 and 84 in side flanges 86 and 88 of the outer part 64. The fasteners 72 and 74 have springs around them, an example being a helical spring 92, which is located in a well 93 in the flange 88. The springs such as the spring 92 are preloaded so as to provide a force pulling a central wedge portion 94 of the wedge element 70 into a wedge-receiving channel 98 between the parts 62 and 64. The channel 98 is defined by respective facing sloped surfaces 102 and 104 of the parts 62 and 64. The central wedge portion 94 has a trapezoidal cross-section shape, with sloped side surfaces 106 and 108 that engage the respective sloped surfaces 102 and 104. The slope of the wedge portion 94 may be 15 degrees, or about 15 degrees, or between 10 and 20 degrees, to give non-limiting example values and ranges. Other angles may be used depending on the requirements for the system in operation.

Figure 4:
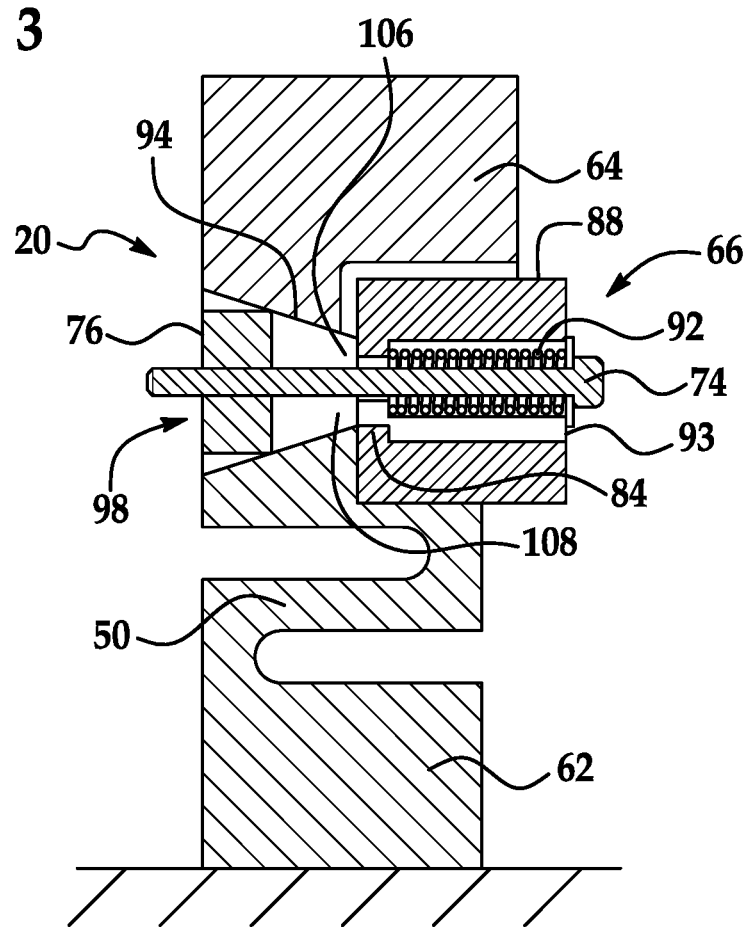
FIG. 4 is a side sectional view of the isolator of FIG. 3 in a first position.
Figure 5:
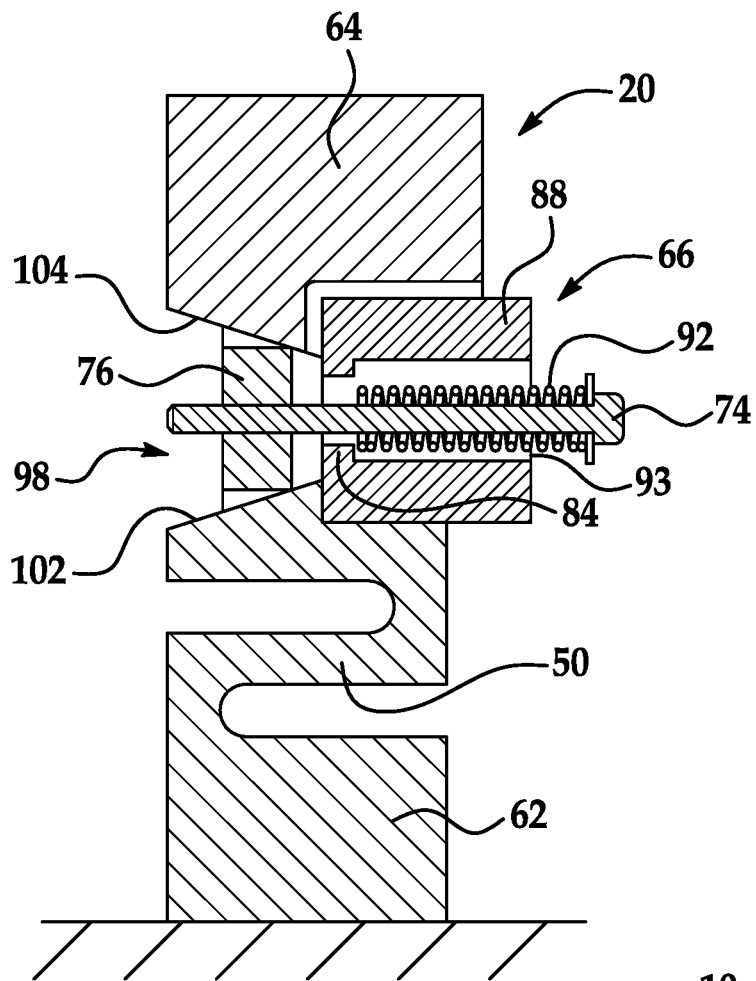
FIG. 5 is a side sectional view of the isolator of FIG. 3 in a second position.
Figure 6:
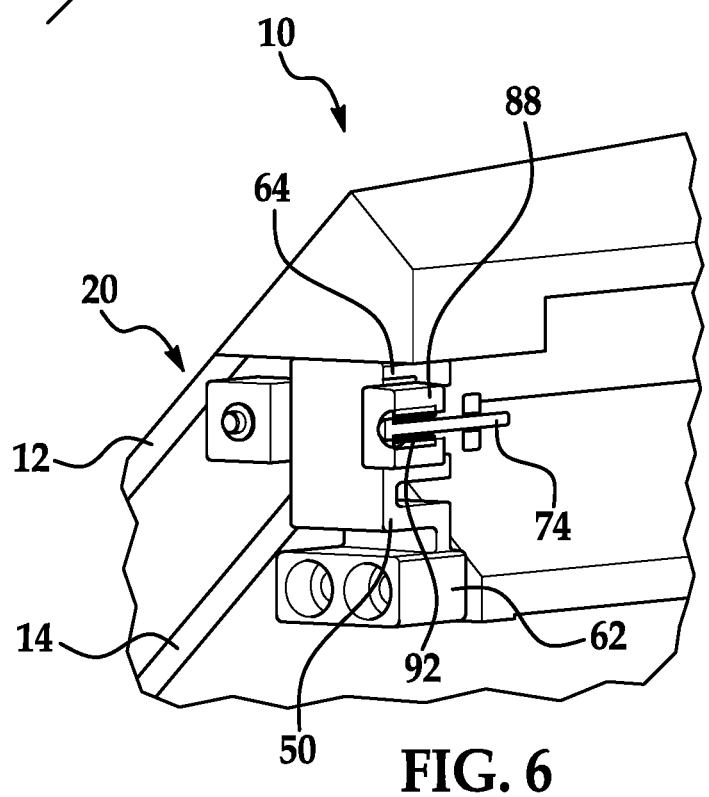
FIG. 6 is an oblique partial sectional of the isolator of FIG. 3, shown in combination with other components of the vibration isolation system.
Figure 7:
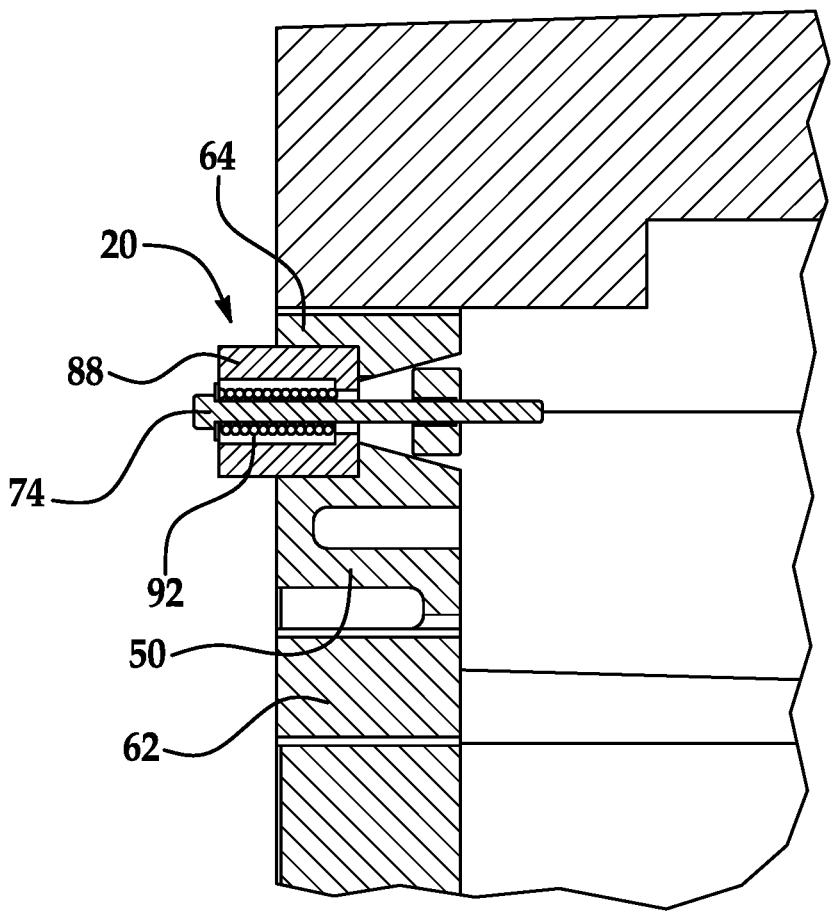
FIG. 7 is a side partially sectional view of the components of FIG. 6.

Movement of the wedge portion 94 is constrained by the relative locations of the inner object 12 (FIG. 1) and the outer housing 14 (FIG. 1). Initially, prior to heating of the housing 14, the object 12 and the housing 14 are relatively close together, as shown in FIG. 4. In this condition the helical springs provide a force pulling the wedge portion 70 against the sloped surfaces 102 and 104. This produces a preload of the isolator 20 against the object 12 and the housing 14.

After the heating of the housing 14 (FIG. 1) the housing 14 expands, moving away from the inner object 12 (FIG. 1). This pulls the parts 62 and 64 away from another, with the wedge portion 70 pulled further inward into the channel 98 by the spring forces, producing the situation shown in FIG. 5. This maintains the preload provided by the isolator 20 against inner object 12 and the outer housing 14. In addition it allows the parts 62 and 64 to be solidly held together and to function essentially as a single piece, allowing the flexure 50 to continue to attenuate vibrations and shocks at a high frequency. It has been found that friction is sufficient to lock up the parts 62 and 64, to prevent even small outward movements of the wedge portion 94 as the wedge element 70 is drawn inward and held in place.

It will be appreciated that many variations are possible for the isolator 20, and the isolator 22, which has a similar configuration. For example the flexure 50 may be in either of the parts, and the wedge element may be mechanically coupled to either of the parts.

The parts 62 and 64 may be made of any of a variety of suitable materials, for example a nickel-chromium-based superalloy marketed as INCONEL 718. The wedge element 70 also may be made of any of a variety of suitable materials, one example of a suitable material being a nitrogen-strengthened stainless steel alloy marketed as NITRONIC 60. It is desirable for the material for the wedge element 70 to be selected so as to minimize, avoid, and/or mitigate wear.

The aft isolators 30-36 (FIG. 2) also include single-piece isolators, the isolators 34 and 36, and multi-piece isolators, the isolators 30 and 32. The isolators 30, 32, 34, and 36 have respective flexures 120, 122, 124, and 126. In the illustrated embodiment the flexures 120 and 122 are oriented in a longitudinal direction, and the flexures 124 and 126 are oriented in a circumferential direction, but other orientations may be used as alternatives. The multi-piece isolators 30 and 32 have configurations similar to those of the isolator 20, described above.

Together the forward isolators 20-26 and the aft isolators 30-36 damp vibrations and shocks between the outer housing 14 and the inner object 12. The sliding of the forward isolators 20-26 compensate for expansions in the longitudinal direction 48. The expansion of the multi-piece isolators 20, 22, 30, and 32 compensates for expansions in the radial direction 58.

The illustrated system 10 has four forward isolators and four aft isolators. Alternatively there may be a different number of isolators, such as three or more than four isolators in the forward or aft parts. Also alternatives are possible regarding which of the isolators are the forward isolators, and which are the aft isolators.

Figure 8:
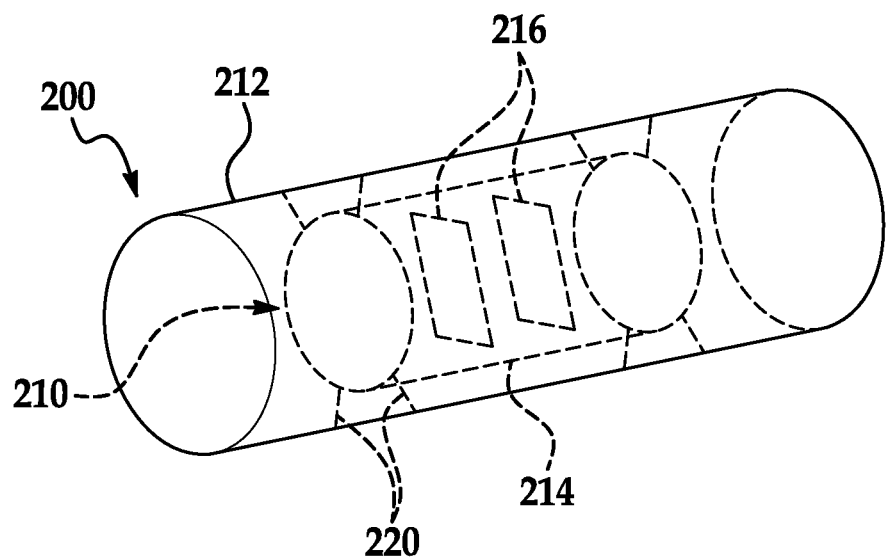
FIG. 8 is an illustration of a possible use of a vibration isolation system, according to an embodiment of the invention.

FIG. 8 shows one employment of a vibration isolation system such as that described above, with a missile 200 including a vibration isolation system 210 to damp shocks or vibrations of a fuselage 212, from a hardware mount 214 that is within the fuselage 212. The hardware mount 214 is used for mounting electronics devices 216, such as card with electronic elements. More broadly the mount 214 may be used to mount other types of hardware or devices to which it is desirable that vibrations or shocks not be transmitted.

The system 210 may include a number of isolators 220, which may be similar to the isolators described above with regard to the system 10 (FIG. 1). The missile 200 may be a supersonic or hypersonic missile, with the fuselage 212 heating up significantly during flight, for example with the fuselage 212 having a temperature rise of 556 to 667 degrees C. (1000 to 1200 degrees F.). This causes the fuselage 212 to expand significantly in longitudinal and radial directions relative to the hardware mount 214. The isolators may include single-piece and multi-part isolators, and fixed-position and slidable isolators to compensate for the expansion of the fuselage 212 due to its rise in temperature.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A vibration isolation system comprising:
an outer housing;
an inner object within the outer housing; and
multiple isolators between the inner object and the outer housing;
wherein each of the multiple isolators includes a flexure;
wherein at least two of the isolators each include an expander to compensate for changes in distance between the inner object and the outer housing, wherein each of the at least two of the isolators includes:
an inner isolator part;
an outer isolator part;
a wedge element as the expander; and
at least one spring;
wherein the at least one spring provides a force on the wedge element to provide a force separating the inner isolator part and the outer isolator part;
wherein the wedge element includes:
at least one hole; and at least one fastener that passes through the hole;
wherein one of the inner isolator part and the outer isolator part includes the flexure;
wherein the flexure acts in series with the expander; and
wherein the inner isolator part and the outer isolator part have respective sloped surfaces that together define a channel that receives a wedge portion of the wedge element.

2. The vibration isolation system of claim 1, wherein the wedge portion has a wedge angle of between 10 and 20 degrees.

3. The vibration isolation system of claim 1, wherein the multiple isolators include single-piece isolators.

4. The vibration isolation system of claim 1, wherein the outer housing is part of a missile.

5. The vibration isolation system of claim 1, wherein the at least one spring includes a pair of springs pulling on opposite sides of the wedge element.

6. The vibration isolation system of claim 1, wherein the multiple isolators include isolators that slide relative to one of the outer housing or the inner object.

7. The vibration isolation system of claim 6, wherein the isolators that slide against contact pads.

8. The vibration isolation system of claim 6, wherein the isolators that slide in a first direction; and
wherein the at least two of the isolators expand in a second direction that is perpendicular to the first direction.

9. The vibration isolation system of claim 8, wherein the first direction is a longitudinal direction.

10. The vibration isolation system of claim 1, wherein the flexures are S-shape flexures.

11. The vibration isolation system of claim 10, wherein middle portions of the S-shape flexures have different orientations for at least one of the S-shape flexures than for other of the S-shape flexures.

12. The vibration isolation system of claim 1, wherein the inner object is a hardware mount.

13. The vibration isolation system of claim 12, further comprising equipment in the hardware mount.

14. The vibration isolation system of claim 12, further comprising electronic cards, electronic devices, or electronic elements in the hardware mount.

15. A vibration isolation system comprising:
an outer housing;
an inner object within the outer housing; and
multiple isolators between the inner object and the outer housing;
wherein each of the multiple isolators includes a flexure;
wherein at least two of the isolators each include an expander to compensate for changes in distance between the inner object and the outer housing, wherein each of the at least two of the isolators includes:
an inner isolator part;
an outer isolator part;
a wedge element as the expander; and
at least one spring;
wherein the at least one spring provides a force on the wedge element to provide a force separating the inner isolator part and the outer isolator part;
wherein the wedge element includes:
at least one hole; and
at least one fastener that passes through the hole;
wherein one of the inner isolator part and the outer isolator part includes the flexure;
wherein the flexure acts in series with the expander; and
wherein the at least one spring includes a pair of springs pulling on opposite sides of the wedge element.

16. The vibration isolation system of claim 15, wherein the multiple isolators include isolators that slide relative to one of the outer housing or the inner object.

17. A vibration isolator comprising:
an inner isolator part;
an outer isolator part;
a wedge element; and
at least one spring;
wherein one of the inner isolator part and the outer isolator part has a flexure and the flexure acts in series with the wedge element; and
wherein the at least one spring provides a force on the wedge element to provide a force separating the inner isolator part and the outer isolator part;
wherein the wedge element includes:
at least one hole; and
at least one fastener that passes through the hole; and
wherein the inner isolator part and the outer isolator part have respective sloped surfaces that together define a channel that receives a wedge portion of the wedge element.

18. The vibration isolator of claim 17, wherein the wedge portion has a wedge angle of between 10 and 20 degrees.

19. A vibration isolator comprising:
an inner isolator part;
an outer isolator part;
a wedge element; and
at least one spring;
wherein one of the inner isolator part and the outer isolator part has a flexure and the flexure acts in series with the wedge element; and
wherein the at least one spring provides a force on the wedge element to provide a force separating the inner isolator part and the outer isolator part;
wherein the wedge element includes:
at least one hole; and
at least one fastener that passes through the hole; and
wherein the at least one spring includes a pair of springs pulling on opposite sides of the wedge element.

* * * * *